(12) United States Patent
Ohse

(10) Patent No.: US 11,081,564 B2
(45) Date of Patent: Aug. 3, 2021

(54) SEMICONDUCTOR DEVICE AND METHOD FOR MANUFACTURING SEMICONDUCTOR DEVICE

(71) Applicant: FUJI ELECTRIC CO., LTD., Kawasaki (JP)

(72) Inventor: Naoyuki Ohse, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/728,700

(22) Filed: Dec. 27, 2019

(65) Prior Publication Data

US 2020/0258996 A1    Aug. 13, 2020

(30) Foreign Application Priority Data

Feb. 7, 2019 (JP) .............................. JP2019-020875

(51) Int. Cl.
| | | |
|---|---|---|
| *H01L 29/45* | (2006.01) | |
| *H01L 29/16* | (2006.01) | |
| *H01L 29/66* | (2006.01) | |
| *H01L 29/417* | (2006.01) | |
| *H01L 29/08* | (2006.01) | |

(52) U.S. Cl.
CPC ........ *H01L 29/456* (2013.01); *H01L 29/0878* (2013.01); *H01L 29/1608* (2013.01); *H01L 29/41725* (2013.01); *H01L 29/66068* (2013.01)

(58) Field of Classification Search
CPC ............. H01L 29/456; H01L 29/1608; H01L 29/66068; H01L 29/1725; H01L 29/0878; H01L 21/0485; H01L 29/45; H01L 29/7813; H01L 29/1095; H01L 29/0623; H01L 29/41741; H01L 21/28052; H01L 21/28061; H01L 21/28518; H01L 21/32051; H01L 21/32053; H01L 21/76889; H01L 21/823418; H01L 21/823414; H01L 21/823443;
(Continued)

(56) References Cited

U.S. PATENT DOCUMENTS

| | | | | |
|---|---|---|---|---|
| 8,669,562 | B2 * | 3/2014 | Tsuchiya | ............... H01L 29/861 257/77 |
| 2006/0273323 | A1 | 12/2006 | Yamamoto et al. | |

(Continued)

FOREIGN PATENT DOCUMENTS

| | | |
|---|---|---|
| JP | 2006344688 A | 12/2006 |
| JP | 2008135611 A | 6/2008 |

(Continued)

*Primary Examiner* — Cuong B Nguyen
(74) *Attorney, Agent, or Firm* — Rabin & Berdo, P.C.

(57) ABSTRACT

A semiconductor device includes a first electrode, a silicon carbide substrate having a first surface electrically connected with the first electrode and a second surface opposite to the first surface, an ohmic junction layer disposed on the second surface, and a second electrode disposed on the ohmic junction layer. The ohmic junction layer has a first layer that is directly disposed on the second surface and includes a first silicide of titanium and a first silicide of a metal element other than titanium, and a second layer that is directly disposed on the first layer, includes a second silicide of titanium and a second silicide of the metal element, and has a lower titanium concentration than the first layer.

12 Claims, 10 Drawing Sheets

(58) Field of Classification Search
CPC ......... H01L 21/823835; H01L 29/4933; H01L 29/665; H01L 29/66507; H01L 29/7845
See application file for complete search history.

(56) References Cited

U.S. PATENT DOCUMENTS

2010/0075474 A1* 3/2010 Kudou .................... H01L 29/45
438/197
2018/0323261 A1 11/2018 Kawai et al.

FOREIGN PATENT DOCUMENTS

| JP | 2011096905 A | 5/2011 |
| JP | 2015103630 A | 6/2015 |
| JP | 2017199807 A | 11/2017 |

* cited by examiner

FIG. 9

|  | FIRST LAYER | SECOND LAYER |
|---|---|---|
| C | 13.3 | 11.7 |
| Si | 16.4 | 18.2 |
| Ti | 29.9 | 18.6 |
| Ni | 40.4 | 51.5 |

UNITS: AT%

SEMICONDUCTOR DEVICE AND METHOD FOR MANUFACTURING SEMICONDUCTOR DEVICE

CROSS REFERENCE TO RELATED APPLICATIONS

This application is based upon and claims the benefit of priority of the prior Japanese Patent Application No. 2019-020875, filed on Feb. 7, 2019, the entire contents of which are incorporated herein by reference.

BACKGROUND OF THE INVENTION

1. Field of the Invention

The present invention relates to a semiconductor device and to a method for manufacturing the semiconductor device.

2. Description of the Related Art

In recent years there has been increasing interest in silicon carbide (SiC) as a semiconductor material to be used in place of silicon (Si). Since the band gap in silicon carbide is about 3 times larger than that of silicon, it reduces the on-resistance of the semiconductor device while also resulting in excellent operating properties at high temperature. In addition, since the thermal conductivity of silicon carbide is greater than that of silicon, a cooling device used to cool the semiconductor device can be reduced in size.

Silicon carbide which exhibits these features is expected to have applications in semiconductor devices for electric power, for example.

Semiconductor devices provided with a silicon carbide substrate include vertical semiconductor devices, in which current flows in the thickness direction of the silicon carbide substrate. An element region with an added impurity is formed on the first surface side of the silicon carbide substrate, while a first electrode that is electrically connected to the element region is also disposed on it. On the second surface side of the silicon carbide substrate, a silicide layer as a compound comprising a metal and silicon is disposed on the second surface, with a second electrode being disposed on the silicide layer. Current flows between the first electrode and second electrode during operation of the semiconductor device.

Since the silicon carbide substrate has a Schottky barrier formed with the metal electrode and is not in ohmic contact, a second electrode is disposed as an ohmic electrode via the silicide layer, which is in ohmic contact with the silicon carbide substrate.

Japanese Laid-Open Patent Publication No. 2008-135611, for example, proposes forming fine irregularities on the back side of a silicon carbide substrate, forming a nickel thin-film on the back side on which the irregularities have been formed, and irradiating the nickel thin-film with laser light to form an ohmic electrode. Heating by irradiation of the laser light causes a portion of the nickel thin-film to react with the silicon of the silicon carbide substrate so that a silicide layer is formed, with the nickel thin-film electrode being in ohmic contact with the silicon carbide substrate via the silicide layer.

With the technique proposed in Japanese Laid-Open Patent Publication No. 2008-135611, when heat generated by irradiation of laser light causes a portion of the nickel thin-film to react with the silicon in the silicon carbide substrate so that a silicide layer is formed, carbon that has separated from the silicon is deposited. The carbon in the silicide layer located between the ohmic electrode and the silicon carbide substrate may constitute a cause of detachment of the ohmic electrode from the silicon carbide substrate.

SUMMARY

In a first aspect of the present invention, a semiconductor device is provided. The semiconductor device may include a first electrode a silicon carbide substrate having a first surface electrically connected with the first electrode, and a second surface opposite to the first surface an ohmic junction layer disposed on the second surface and a second electrode disposed on the ohmic junction layer, wherein the ohmic junction layer includes a first layer that is directly disposed on the second surface and includes a first silicide of titanium and a first silicide of a metal element other than titanium, and a second layer that is directly disposed on the first layer, includes a second silicide of titanium and a second silicide of the metal element, and has a lower titanium concentration than the first layer.

The metal element in the second layer may have a concentration higher than that of the element in the first layer.

Each of the first layer and second layer may include carbon, and carbon in the first layer may have a concentration higher than that of carbon in the second layer.

Silicon in the second layer may have a concentration higher than that of silicon in the first layer.

The metal element may have a melting point lower than that of titanium.

The metal element may include at least one from among nickel, molybdenum, tantalum, tungsten, palladium and cobalt.

In a second aspect of the invention, a method for manufacturing a semiconductor device is provided. The method for manufacturing a semiconductor device may include a step of preparing a substrate structure that includes a first electrode and a silicon carbide substrate having a first surface electrically connected to the first electrode, and having a second surface opposite to the first surface, forming a titanium layer on the second surface of the substrate structure, forming a metal element layer including a metal element other than titanium that is bondable with silicon to form a silicide, on the titanium layer, irradiating the metal element layer with laser light to form an ohmic junction layer having a first layer that includes a first silicide of titanium and a first silicide of the metal element other than titanium, directly disposed on the second surface of the substrate structure, and a second layer that includes a second silicide of titanium and a second silicide of the metal element, directly disposed on the first layer, the second layer having a lower titanium concentration than the first layer, and forming a second electrode on the ohmic junction layer.

Objects, features, and advantages of the present invention are specifically set forth in or will become apparent from the following detailed description of the invention when read in conjunction with the accompanying drawings.

BRIEF DESCRIPTION OF DRAWINGS

FIG. 9 is a table showing the results of elemental analysis of the semiconductor device of the Example.

DESCRIPTION OF EMBODIMENTS

A first preferred embodiment of the semiconductor device disclosed herein will now be described with reference to the accompanying drawings.

Throughout the present specification and the accompanying drawings, the layers or regions denoted by "n" indicate electrons as the majority carrier, and the layers or regions denoted by "p" indicate positive holes as the majority carrier. The symbol "+" attached to "n" or "p" indicates a higher impurity concentration compared to layers or regions without the symbol, and the symbol "−" attached to "n" or "p" indicates lower impurity concentration compared to layers or regions without the symbol.

In representing the Miller index, "−" represents a bar attached to the index immediately following it, while "−" before a Miller index indicates a negative index. The following embodiment will be explained with the assumption that the first conductive type is n-type and the second conductive type is p-type.

Figure 1:
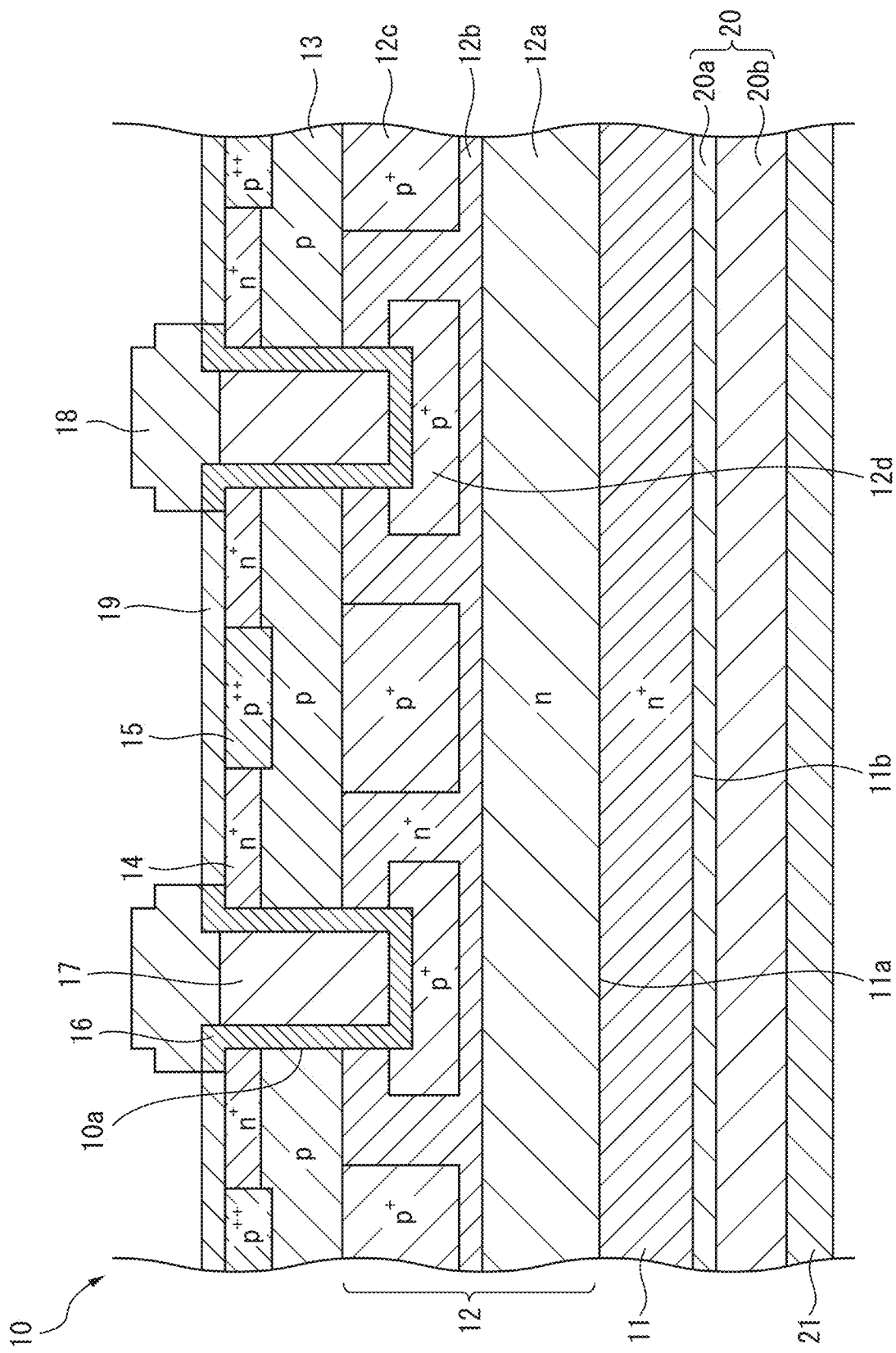
FIG. 1 is a cross-sectional view showing a first embodiment of the semiconductor device disclosed herein.

FIG. 1 is a cross-sectional view showing a first embodiment of the semiconductor device disclosed herein.

The semiconductor device 10 of this embodiment is a semiconductor device having a silicon carbide substrate. Specifically, the semiconductor device 10 is a vertical MOSFET (Metal Oxide Semiconductor Field Effect Transistor) having a trench-type gate electrodes.

The semiconductor device 10 comprises an $n^+$-type silicon carbide substrate 11 of a first conductive type, an n-type silicon carbide epitaxial layer 12 of the first conductive type, a p-type silicon carbide epitaxial layer 13 of a second conductive type, a source region 14 of the first conductive type, and a contact region 15 of the second conductive type. The semiconductor device 10 also comprises a gate insulating film 16, gate electrodes 17, an interlayer dielectric film 18, a source electrode 19, an ohmic junction layer 20 and a drain electrode 21.

The $n^+$-type silicon carbide substrate 11 is a single crystal silicon carbide substrate doped with an impurity that imparts polarity of the first conductive type, such as nitrogen. The $n^+$-type silicon carbide substrate 11 has a first surface 11a and a second surface 11b. The first surface 11a and second surface 11b of the $n^+$-type silicon carbide substrate 11 are (0001) faces (Si faces). The first surface 11a and second surface 11b may also be (000-1) faces (C faces).

The n-type silicon carbide epitaxial layer 12 is disposed on the first surface 11a of the $n^+$-type silicon carbide substrate 11. The n-type silicon carbide epitaxial layer 12 has an n-type region 12a of the first conductive type, an $n^+$-type region 12b of the first conductive type, a first $p^+$ base region 12c of the second conductive type, and a second $p^+$ base region 12d of the second conductive type.

The n-type region 12a is a region disposed on the first surface 11a of the $n^+$-type silicon carbide substrate 11. The n-type region 12a is an n-type drift layer, as a silicon carbide epitaxial layer doped with an impurity that imparts polarity of the first conductive type, such as nitrogen, at a lower impurity concentration than the $n^+$-type silicon carbide substrate 11.

The $n^+$-type region 12b is disposed on the n-type region 12a. The $n^+$-type region 12b is formed by doping a silicon carbide epitaxial layer with an impurity that imparts polarity of the first conductive type, such as nitrogen, at a lower impurity concentration than the $n^+$-type silicon carbide substrate 11 and a higher impurity concentration than the n-type region 12a.

The first $p^+$ base region 12c and second $p^+$ base region 12d are disposed within the $n^+$-type region 12b. The first $p^+$ base region 12c and second $p^+$ base region 12d are formed with doping of a silicon carbide epitaxial layer with an impurity that imparts polarity of the second conductive type, such as aluminum.

The p-type silicon carbide epitaxial layer 13 is disposed on the n-type silicon carbide epitaxial layer 12. The p-type silicon carbide epitaxial layer 13 is formed by doping of a silicon carbide epitaxial layer with an impurity that imparts polarity of the second conductive type, such as aluminum, at a lower impurity concentration than the first $p^+$ base region 12c and second $p^+$ base region 12d.

A trench 10a is situated reaching through the p-type silicon carbide epitaxial layer 13 up to the n-type silicon carbide epitaxial layer 12. The gate insulating film 16 and gate electrodes 17 are disposed inside the trench 10a. The gate insulating film 16 is disposed at the base and side sections of the trench 10a, along the inner walls of the trench 10a. The gate electrodes 17 are disposed on the inner side of the gate insulating film 16. Part of each gate electrode 17 may also be protruding upward from the trench 10a. In the example shown in FIG. 1, the semiconductor device 10 has two trenches 10a (each consisting of a gate insulating film 16 and gate electrode 17) but the semiconductor device 10 may have even more trenches.

The portion of the p-type silicon carbide epitaxial layer 13 near the gate insulating film 16 forms a channel region. During operation of the semiconductor device 10, current between the first electrode and second electrode passes through the channel region.

The second $p^+$ base region 12d is disposed below the trench 10a. The first $p^+$ base region 12c is disposed between the two trenches 10a that are adjacent. A portion of the first $p^+$ base region 12c may also extend toward the trench 10a side and connect to the second $p^+$ base region 12d.

The source region 14 and contact region 15 are disposed at the top of the p-type silicon carbide epitaxial layer 13.

The source region 14 is disposed surrounding the trench 10a, in the plan view. The source region 14 is formed by doping a silicon carbide epitaxial layer with an impurity that imparts polarity of the first conductive type, such as nitrogen, at a higher impurity concentration than the n-type region 12a.

The contact region 15 is disposed between the two source regions 14 that are adjacent. The contact region 15 is formed by doping of a silicon carbide epitaxial layer with an impurity that imparts polarity of the second conductive type, such as aluminum, at a higher impurity concentration than the first $p^+$ base region 12c and second $p^+$ base region 12d.

The interlayer dielectric film 18 is disposed on each gate electrode 17, covering the gate electrode 17. The interlayer dielectric film 18 has an opening where the source electrode 19 is exposed, between the two gate electrodes 17 that are adjacent.

The source electrode 19 is electrically connected to the source region 14 and contact region 15. The source electrode 19 is electrically insulated from the gate electrodes 17 by the interlayer dielectric film 18 and gate insulating film 16.

An ohmic junction layer 20 is disposed on the second surface 11b of the $n^+$-type silicon carbide substrate 11 (the lower side of the $n^+$-type silicon carbide substrate 11 in FIG. 1).

A drain electrode 21 is disposed below the ohmic junction layer 20. The drain electrode 21 is formed, for example, by laminating layers of titanium, nickel and gold in that order from the ohmic junction layer 20 side.

The semiconductor device 10 is a switching element that is able to apply a voltage of at least a threshold value to the gate electrodes 17, to form a state of conduction at the channel region between the source electrode 19 and the drain electrode 21. The majority carrier flowing between the source electrode 19 and drain electrode 21 in the state of conduction consists of electrons, the semiconductor device 10 being a first conductive type (n-type) MOSFET.

The ohmic junction layer 20 will now be described in further detail.

The ohmic junction layer 20 includes a silicide of titanium and a silicide of a metal element other than titanium, forming ohmic contact between the metal drain electrode 21 and $n^+$-type silicon carbide substrate 11. More specifically, in the manufacturing steps for the semiconductor device 10, the ohmic junction layer 20 is created by forming a titanium-containing titanium layer on the second surface 11b of the substrate structure that includes the source electrode 19 and the $n^+$-type silicon carbide substrate 11, forming an ohmic junction metal element layer on the titanium layer, and irradiating the ohmic junction metal element layer with laser light. The ohmic junction metal element is preferably selected from among nickel, molybdenum, tantalum, tungsten, palladium and cobalt. The silicon in the ohmic junction layer 20 is that produced upon decomposition of silicon carbide forming the $n^+$-type silicon carbide substrate 11, during formation of the ohmic junction layer 20.

Since production of the carbon deposition layer is inhibited near the boundary of the ohmic junction layer 20 with the $n^+$-type silicon carbide substrate 11, detachment of the drain electrode 21 from the $n^+$-type silicon carbide substrate 11 is prevented. More specifically, during the manufacturing steps for the semiconductor device 10, the carbon in the ohmic junction layer 20 is that produced upon decomposition of silicon carbide forming the $n^+$-type silicon carbide substrate 11, during formation of the ohmic junction layer 20.

Moreover, since the ohmic junction layer 20 does not include many voids formed during production of the semiconductor device 10, detachment of the drain electrode 21 from the $n^+$-type silicon carbide substrate 11 is prevented.

The ohmic junction layer 20 has a first layer 20a and a second layer 20b.

The first layer 20a is disposed directly on the second surface 11b of the $n^+$-type silicon carbide substrate 11, and includes a silicide of titanium, carbon, and a silicide of an ohmic junction metal element other than titanium. More specifically, during the manufacturing steps for the semiconductor device 10, the first layer 20a is formed from the titanium in the titanium layer disposed on the second surface 11b of the $n^+$-type silicon carbide substrate 11, the ohmic junction metal element in the ohmic junction metal element layer disposed under the titanium layer, and the carbon and silicon resulting from decomposition of the silicon carbide forming the $n^+$-type silicon carbide substrate 11.

A portion of the titanium and silicon in the first layer 20a are included in the form of a titanium and silicon compound (the aforementioned titanium silicide), forming ohmic contact between the drain electrode 21 and the $n^+$-type silicon carbide substrate 11.

The titanium and carbon in the first layer 20a is preferably in the state of a titanium and carbon compound (for example, titanium carbide), from the viewpoint of minimizing carbon deposition layer production. The carbon concentration in the first layer 20a is preferably higher than in the second layer 20b, since a portion of the titanium and carbon forms a titanium and carbon compound as mentioned above.

Portions of the ohmic junction metal element and silicon in the first layer 20a are included in the form of compounds of the ohmic junction metal element and silicon (for example, nickel silicide), forming ohmic contact between the drain electrode 21 and the $n^+$-type silicon carbide substrate 11.

The second layer 20b is disposed directly below the first layer 20a formed on the second surface 11b of the $n^+$-type silicon carbide substrate 11, and it includes a silicide of titanium, carbon, and a silicide of an ohmic junction metal element other than titanium, while also having a lower titanium concentration than the first layer 20a. More specifically, during the manufacturing steps for the semiconductor device 10, the second layer 20b is formed from the titanium in the titanium layer disposed on the second surface 11b of the $n^+$-type silicon carbide substrate 11, the ohmic junction metal element in the ohmic junction metal element layer disposed under the titanium layer, and the carbon and silicon resulting from decomposition of the silicon carbide forming the $n^+$-type silicon carbide substrate 11.

The first layer 20a and second layer 20b preferably include at least one from among nickel, molybdenum, tantalum, tungsten, palladium and cobalt as an ohmic junction metal element.

Portions of the ohmic junction metal element and silicon in the second layer 20b are included in the form of a metal silicide (for example, nickel silicide), forming an ohmic contact between the drain electrode 21 and the $n^+$-type silicon carbide substrate 11.

The ohmic junction metal element preferably reacts more readily with silicon than titanium to form a silicide, from the viewpoint of obtaining satisfactory ohmic contact with the $n^+$-type silicon carbide substrate 11.

The melting point of the ohmic junction metal element is preferably lower than the melting point of titanium, from the viewpoint of avoiding formation of a carbon deposition layer and voids inside the ohmic junction layer 20. This will be further explained below in regard to the production steps for the semiconductor device 10.

The silicon concentration in the second layer 20b is preferably higher than in the first layer 20a because this corresponds to a situation in which the second layer 20b includes numerous ohmic junction metal element silicides (for example, nickel silicide), such that the second layer 20b will be able to be in satisfactory ohmic contact with the n+-type silicon carbide substrate 11.

From the same viewpoint, the concentration of the ohmic junction metal element in the second layer 20b is preferably higher than in the first layer 20a.

The thickness of the first layer 20a is preferably 10 nm to 150 nm, and most preferably 20 nm to 60 nm.

If the thickness of the first layer 20a is 10 nm or greater, the carbon produced during formation of the ohmic junction layer 20 will be retained in the first layer 20a as a reaction product with titanium (for example, titanium carbide), resulting in a state with little production of a carbon deposition layer. Moreover, if the thickness of the first layer 20a is 10 nm or greater, the thickness of the layer including titanium silicide as a compound of titanium and silicon will be ensured, and satisfactory ohmic contact will be obtained between the drain electrode 21 and the n+-type silicon carbide substrate 11.

If the thickness of the first layer 20a is no greater than 150 nm, then the resistance value of the first layer 20a will be low and the mechanical strength including transverse strength of the semiconductor device 10 can be ensured.

The thickness of the second layer 20b is preferably 30 nm to 900 nm, and most preferably 60 nm to 580 nm.

If the thickness of the second layer 10b is 30 nm or greater, the thickness including metal silicides as compounds of ohmic junction metal elements and silicon (for example, nickel silicide) will be ensured, and satisfactory ohmic contact will be obtained between the drain electrode 21 and the n+-type silicon carbide substrate 11.

If the thickness of the second layer 10b is no greater than 900 nm, then the resistance value of the second layer 10b will be low and the mechanical strength including transverse strength of the semiconductor device 10 can be ensured. From the same viewpoint, the thickness of the ohmic junction layer 20 is preferably 40 nm to 700 nm, and most preferably 120 nm to 600 nm.

Since the ohmic junction layer in the semiconductor device of this embodiment as described above has a thinner carbon deposition layer and few voids, detachment of the drain electrode (the ohmic electrode) from the n+-type silicon carbide substrate is inhibited. The semiconductor device therefore has high durability.

The ohmic junction layer of the semiconductor device of this embodiment preferably has a construction obtained by forming a titanium layer on the second surface of a substrate structure that includes a source electrode and a silicon carbide substrate, forming an ohmic junction metal element layer on the titanium layer, and irradiating the ohmic junction metal element layer with laser light, and the ohmic junction layer preferably has a first layer that is directly disposed on the second surface and includes a silicide of titanium and a silicide of a metal element other than titanium, and a second layer that is directly disposed on the first layer and includes a silicide of titanium and a silicide of an ohmic junction metal element, while also having a lower titanium concentration than the first layer. Thus, the semiconductor device of this embodiment preferably has production steps as elements of its construction. The reason that the semiconductor device of this embodiment has production steps as elements of its construction is as follows. The difference between the semiconductor device of this embodiment and the prior art is that a thinner carbon deposition layer and few voids are present in the ohmic junction layer; however, in light of the non-homogeneity of the ohmic junction layer, it is not possible to use general language in identifying the structure and properties based on this difference. On the other hand, while it may be possible in principle to determine the construction of the carbon deposition layer and voids in the ohmic junction layer using electron microscope observation or elemental analysis, it would be necessary to fabricate a statistically significant number of semiconductor devices for both the semiconductor device of this embodiment and the prior art, to determine the results of electron microscope observation and elemental analysis, and to perform statistical processing for them, and then to discover significant indexes and their values that distinguish this embodiment from the prior art, a process which would require tremendous time and cost. In addition, because of the vast number of possibilities of the prior art, it is difficult to unambiguously determine a number that would be statistically significant. It is not practical, therefore, to find the indexes and their values in order to directly determine the features of the semiconductor device of this embodiment based on the physical structure or properties alone. With this in mind, the manufacturing steps may be included as elements of the construction of the semiconductor device of this embodiment in order to specify the prescribed feature of having a thinner carbon deposition layer and few voids in the ohmic junction layer.

The second embodiment of the semiconductor device will now be described with reference to FIG. 2. The detailed explanation provided for the first embodiment applies for any aspects of the second embodiment that are not explained here. Structures corresponding to those of the first embodiment are indicated by like reference numerals.

Figure 2:
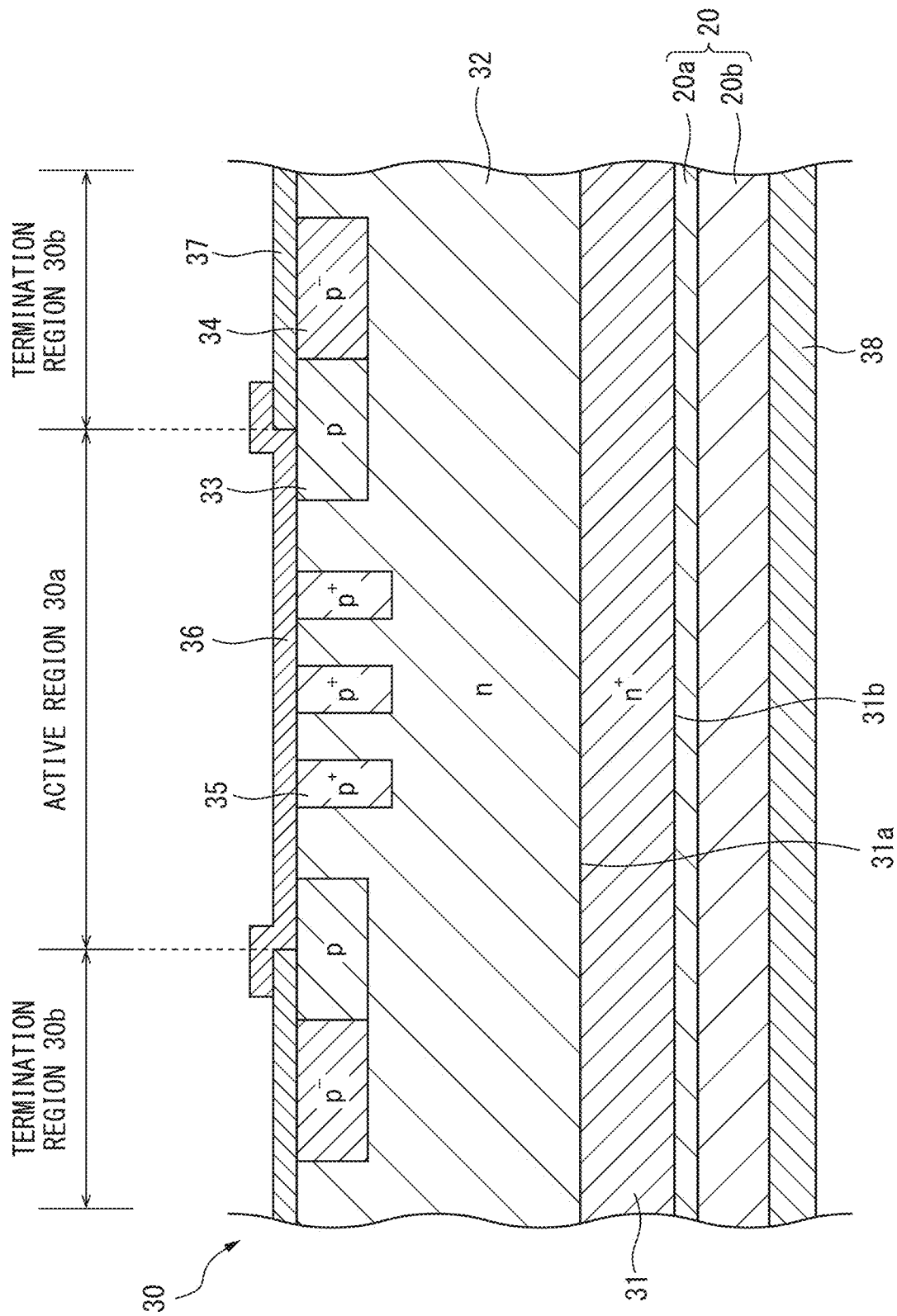
FIG. 2 is a cross-sectional view showing a second embodiment of the semiconductor device disclosed herein.

FIG. 2 is a cross-sectional view showing the second embodiment of the semiconductor device disclosed herein.

The semiconductor device 30 of this embodiment is a semiconductor device having a silicon carbide substrate. Specifically, the semiconductor device 30 is a vertical Schottky barrier diode.

The semiconductor device 30 comprises an n+-type silicon carbide substrate 31 of a first conductive type, an n-type silicon carbide epitaxial layer 32 of the first conductive type, a p-type region 33 of a second conductive type, a p−-type region 34 of the second conductive type, a p+-type region 35 of the second conductive type, a Schottky electrode 36 as the anode, an interlayer dielectric film 37, an ohmic junction layer 20, and a back electrode 38 as the cathode.

The n+-type silicon carbide substrate 31 is a single crystal silicon carbide substrate doped with an impurity that imparts polarity of the first conductive type, such as nitrogen. The n+-type silicon carbide substrate 31 has a first surface 31a and a second surface 31b.

The n-type silicon carbide epitaxial layer 32 is disposed on the first surface 31a of the n+-type silicon carbide substrate 31. The n-type silicon carbide epitaxial layer 32 is an n-type drift layer, as a silicon carbide epitaxial layer doped with an impurity that imparts polarity of the first conductive type, such as nitrogen, at a lower impurity concentration than the n+-type silicon carbide substrate 31.

The p-type region 33 and p−-type region 34 are disposed at the top of the n-type silicon carbide epitaxial layer 32.

The p-type region 33 and p−-type region 34 have ring shapes in the plan view. The p−-type region 34 is situated adjacent to the p-type region 33, on the outer side of the p-type region 33.

The p-type region 33 is formed by doping a silicon carbide epitaxial layer with an impurity that imparts polarity of the second conductive type, such as aluminum.

The p−-type region 34 is formed by doping a silicon carbide epitaxial layer with an impurity that imparts polarity of the second conductive type, such as aluminum, at a lower impurity concentration than the p-type region 33.

The p$^+$-type region 35 is situated apart from the p-type region 33, on the inner side of the p-type region 33. The p$^+$-type region 35 is formed by doping a silicon carbide epitaxial layer with an impurity that imparts polarity of the second conductive type, such as aluminum, at a higher impurity concentration than the p-type region 33.

The Schottky electrode 36 is disposed on the n-type silicon carbide epitaxial layer 32, covering part of the p$^+$-type region 35 and p-type region 33.

An active region 30a with a Schottky barrier is formed at the joining section between the Schottky electrode 36 and the n-type silicon carbide epitaxial layer 32.

In the active region 30a, a plurality of p$^+$-type regions 35 are disposed at predetermined intervals, forming a JBS (Junction Barrier Schottky) structure. The junctions between the plurality of p$^+$-type regions 35 and the Schottky electrode 36 may also be ohmic junctions, or they may be Schottky junctions.

A termination region 30b is formed around the active region 30a. In the termination region 30b, a ring-shaped p$^-$-type region 34 is disposed surrounding the Schottky electrode 36, in the plan view. The p-type region 33 is disposed straddling from the edge of the active region 30a up to the termination region 30b.

The p-type region 33 and p$^-$-type region 34 form a high voltage resistant structure that relaxes the electric field in the termination region 30b and prevents high voltage degradation of the semiconductor device 30. Specifically, the p-type region 33 has the function of keeping the electric field from being concentrated at the joining edge of the n-type silicon carbide epitaxial layer 32 and Schottky electrode 36. In addition, the p$^-$-type region 34 has the function of further dispersing the electric field at the periphery of the active region 30a.

The interlayer dielectric film 37 is disposed on the n-type silicon carbide epitaxial layer 32, covering the top of the p-type region 33 and p$^-$-type region 34 at the termination region 30b.

The Schottky electrode 36 covers the surface of the n-type silicon carbide epitaxial layer 32 that is exposed at the active region 30a, contacting with the p-type region 33 at the periphery of the active region 30a. The Schottky electrode 36 extends from the active region 30a through the termination region 30b, while the edges of the termination region 30b of the Schottky electrode 36 extend up to the top of the p-type region 33. The Schottky electrode 36 covers the p-type region 33 via the interlayer dielectric film 37.

The Schottky electrode 36 may be suitably formed using a Group IVa metal, Group Va metal, Group VIa metal, aluminum or silicon, for example. The Schottky electrode 36 may also be suitably formed using a material including two or three elements from among Group IVa metals, Group Va metals, Group VIa metals, aluminum and silicon.

The height of the Schottky barrier between the Schottky electrode 36 and the n-type silicon carbide epitaxial layer 32 is preferably 1 eV or greater, for example, when the semiconductor device 30 is to be used as a high voltage resistance semiconductor device. When the semiconductor device 30 is to be used as an electric power unit, for example, the height of the Schottky barrier of the Schottky electrode 36 is preferably 0.5 eV or greater and less than 1 eV.

An ohmic junction layer 20 is disposed on the second surface 31b of the n$^+$-type silicon carbide substrate 11 (the lower side of the n$^+$-type silicon carbide substrate 31 in FIG. 2).

A back electrode 38 is disposed below the ohmic junction layer 20.

When a forward voltage is applied, with positive to the Schottky electrode 36 and negative to the back electrode 38, the semiconductor device 30 is in a state of forward conduction in which electrons flow from the back electrode 38 side to the Schottky electrode 36 side. Conversely, when a reverse voltage is applied, with negative to the Schottky electrode 36 and positive to the back electrode 38, the semiconductor device 30 is in a state of reverse blocking. The majority carrier flowing between the Schottky electrode 36 and the back electrode 38 in the state of forward conduction consists of electrons, the semiconductor device 10 being a first conductive type (n-type) diode.

The above explanation for the first embodiment applies as appropriate to the ohmic junction layer 20.

The semiconductor device of the embodiment described above exhibits the same effect as the first embodiment.

A preferred embodiment of a method for manufacturing the semiconductor device disclosed herein will now be explained with reference to FIG. 3 to FIG. 6.

The method for manufacturing the semiconductor device of this embodiment produces a semiconductor device as shown in FIG. 1.

Figure 3:
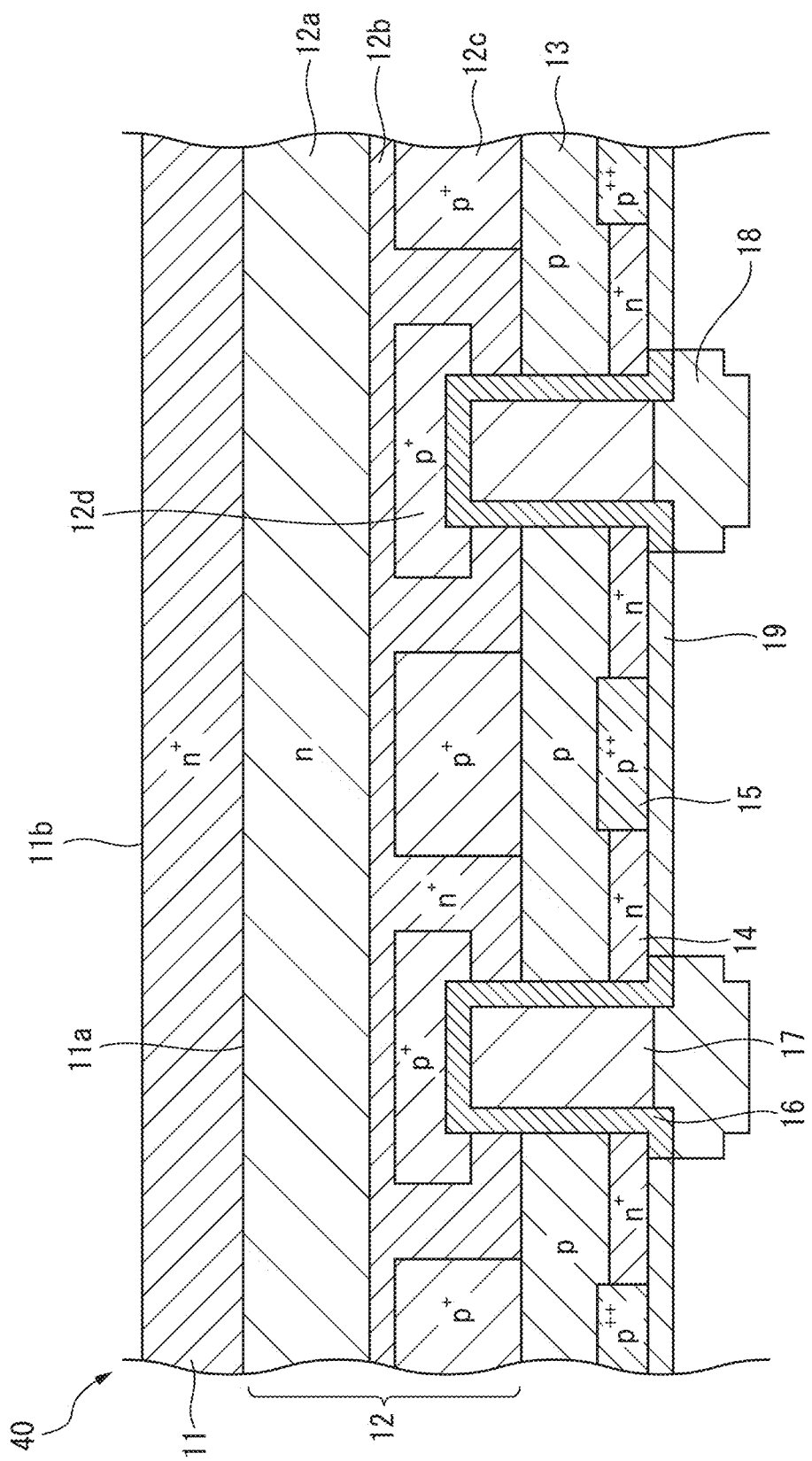
FIG. 3 is a diagram (1) illustrating the steps of one embodiment of the method for manufacturing the semiconductor device disclosed herein.

First, as shown in FIG. 3, a substrate structure 40 is prepared comprising an n$^+$-type silicon carbide substrate 11, an n-type silicon carbide epitaxial layer 12, a p-type silicon carbide epitaxial layer 13, a source region 14, a contact region 15, a gate insulating film 16, gate electrodes 17, an interlayer dielectric film 18 and a source electrode 19.

The substrate structure 40 has the structure of the semiconductor device shown in FIG. 1, but without the ohmic junction layer and the drain electrode.

The n$^+$-type silicon carbide substrate 11 may have the second surface 11b side shaved for smaller thickness.

Figure 4:
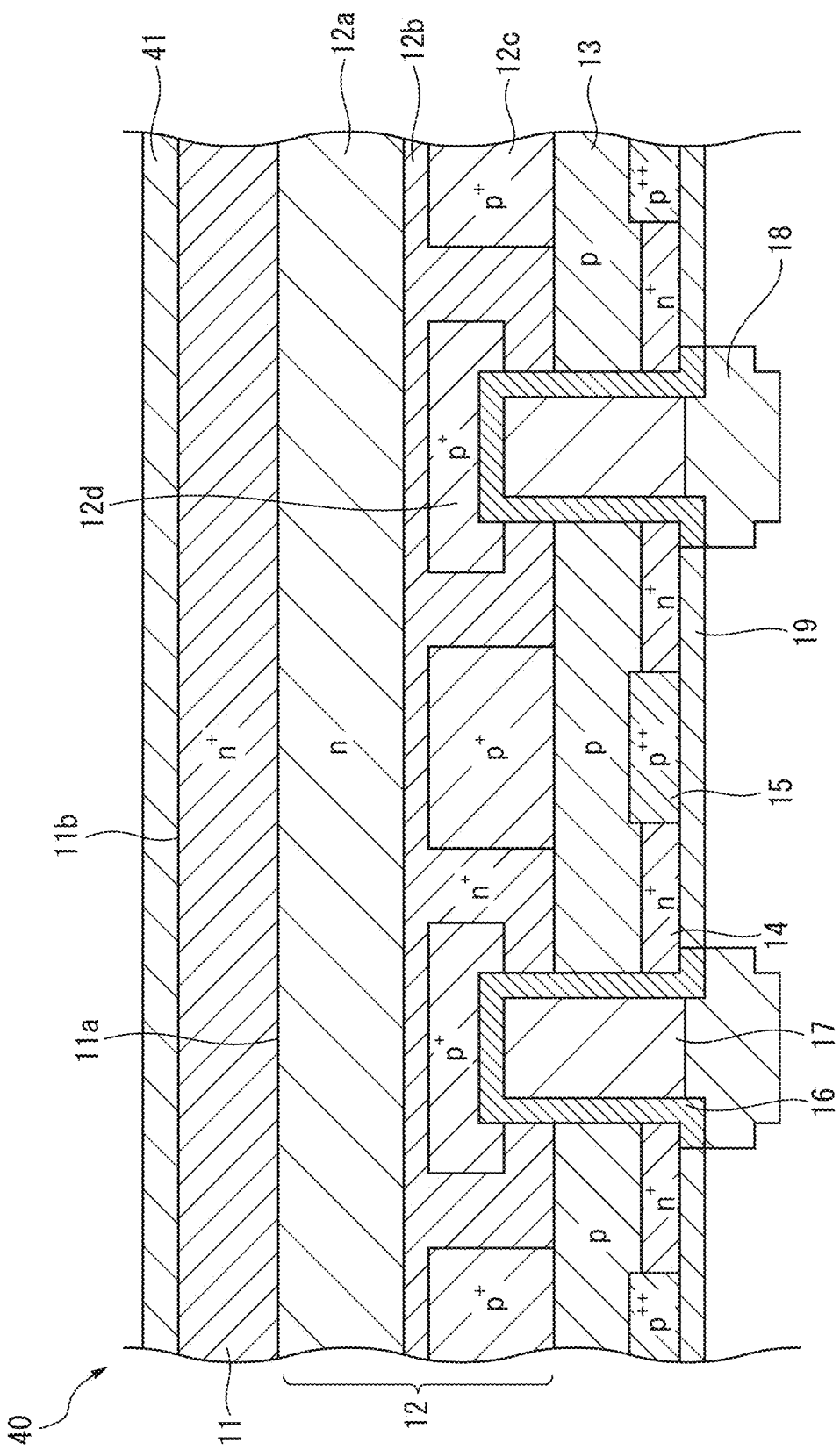
FIG. 4 is a diagram (2) illustrating the steps of one embodiment of the method for manufacturing the semiconductor device disclosed herein.

Next, a titanium layer 41 containing titanium is formed on the second surface 11b of the n$^+$-type silicon carbide substrate 11 of the substrate structure 40, as shown in FIG. 4. The method of forming the titanium layer 41 may employ sputtering or vapor deposition, for example.

The thickness of the titanium layer 41 is preferably a thickness allowing titanium to be supplied in sufficient amount for bonding with carbon released by decomposition of the silicon carbide that forms the n$^+$-type silicon carbide substrate 11, during the step of forming the ohmic junction layer 20 described below. This allows the released carbon to bond with titanium, thus inhibiting production of a carbon deposition layer.

Specifically, the thickness of the titanium layer 41 is preferably 20 nm to 300 nm, and most preferably 40 nm to 120 nm.

If the thickness of the titanium layer 41 is 20 nm or greater it will be possible to supply titanium in sufficient amount to bond with carbon, while stably manufacturing a titanium layer 41 with satisfactory uniformity of thickness and few defects.

If the thickness of the titanium layer 41 is no greater than 300 nm, it will be possible to transfer sufficient heat for formation of the ohmic junction layer 20 to the n$^+$-type silicon carbide substrate 11 in the subsequent step of forming the ohmic junction layer 20. In addition, limiting the thickness of the titanium layer 41 to no greater than 300 nm can ensure mechanical strength, including transverse strength.

Figure 5:
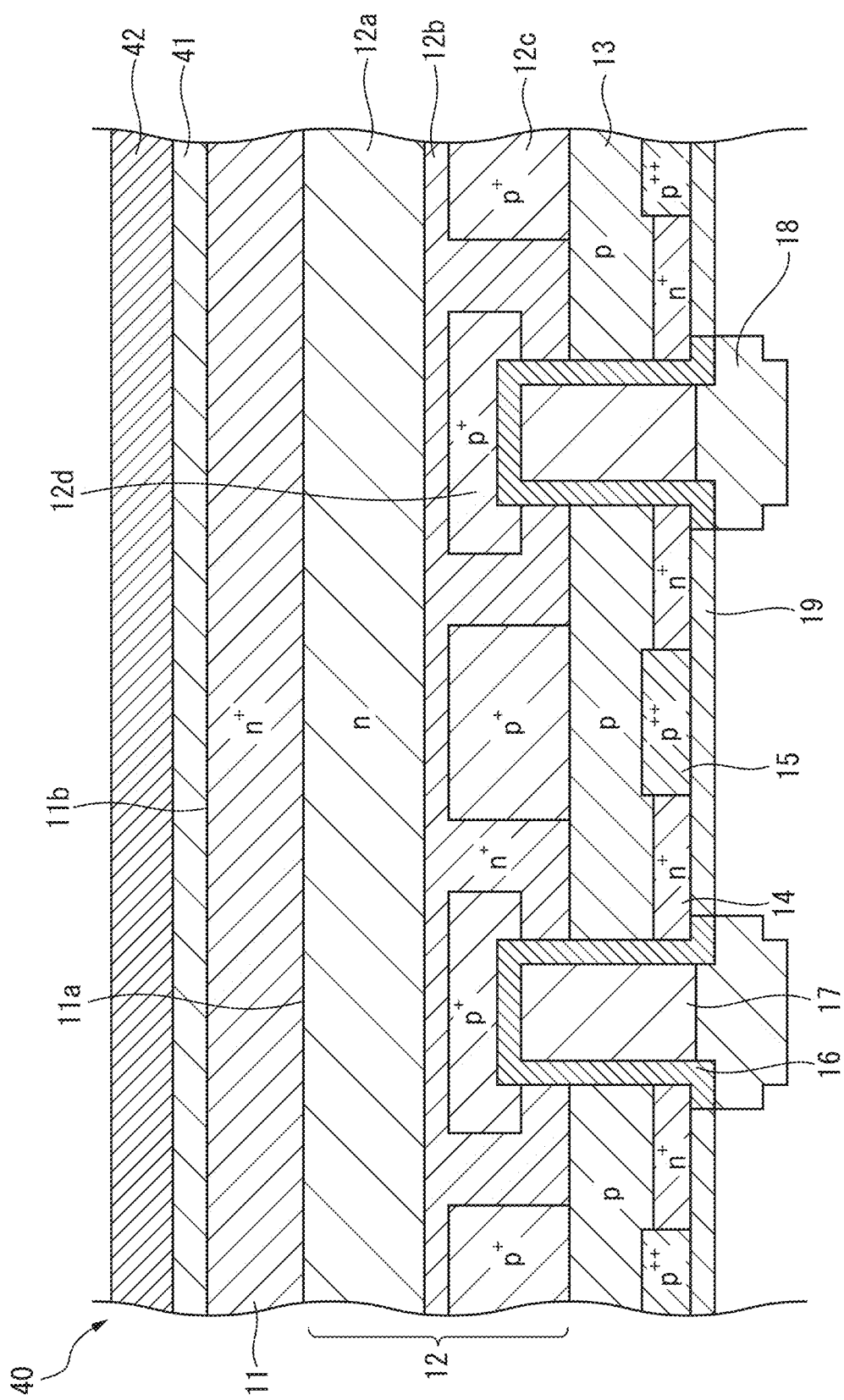
FIG. 5 is a diagram (3) illustrating the steps of one embodiment of the method for manufacturing the semiconductor device disclosed herein.

Next, as shown in FIG. 5, an ohmic junction metal element layer 42 including an ohmic junction metal element different from titanium that is able to bond with silicon to form a silicide, is formed on the titanium layer 41 of the substrate structure 40. The method of forming the ohmic junction metal element layer 42 may employ sputtering or vapor deposition, for example.

It is also possible to use one or more from among nickel, molybdenum, tantalum, tungsten, palladium and cobalt, for example, as an ohmic junction metal element.

Using nickel, palladium or cobalt, which have lower melting points than titanium, as ohmic junction metal elements is particularly preferred from the viewpoint of inhibiting production of a carbon deposition layer and forming an ohmic junction layer 20 with few voids.

The thickness of the ohmic junction metal element layer 42 is preferably a thickness allowing formation of an ohmic junction layer 20 that has a silicide which provides ohmic contact with low contact resistance between the drain electrode 21 and n$^+$-type silicon carbide substrate 11, in the step of forming the ohmic junction layer 20 described below.

Specifically, the thickness of the ohmic junction metal element layer 42 is preferably 20 nm to 1780 nm, and most preferably 20 nm to 300 nm.

If the thickness of the ohmic junction metal element layer 42 is 20 nm or greater it will be possible to stably produce an ohmic junction metal element layer 42 that provides ohmic contact with low contact resistance, that has satisfactory thickness uniformity, and that has few defects.

If the thickness of the ohmic junction metal element layer 42 is no greater than 1780 nm, it will be possible to transfer sufficient heat for formation of the ohmic junction layer 20 to the n$^+$-type silicon carbide substrate 11 in the subsequent step of forming the ohmic junction layer 20. If the thickness of the ohmic junction metal element layer 42 is no greater than 1780 nm, it will be possible to reduce the amount of nickel that remains without reacting with silicon, and to form an ohmic junction layer 20 with low contact resistance.

The ratio THi/THm between the thickness THi of the titanium layer 41 and the thickness THm of the ohmic junction metal element layer 42 is preferably in the range of 0.33<THi/THm<3.

If the ratio THi/THm is 0.33 or greater it will be possible to form an ohmic junction layer 20 with low contact resistance between the drain electrode 21 and the n$^+$-type silicon carbide substrate 11.

If the ratio THi/THm is 3 or lower, carbon deposition layer production can be inhibited and an ohmic junction layer 20 with few voids can be formed.

Figure 6:
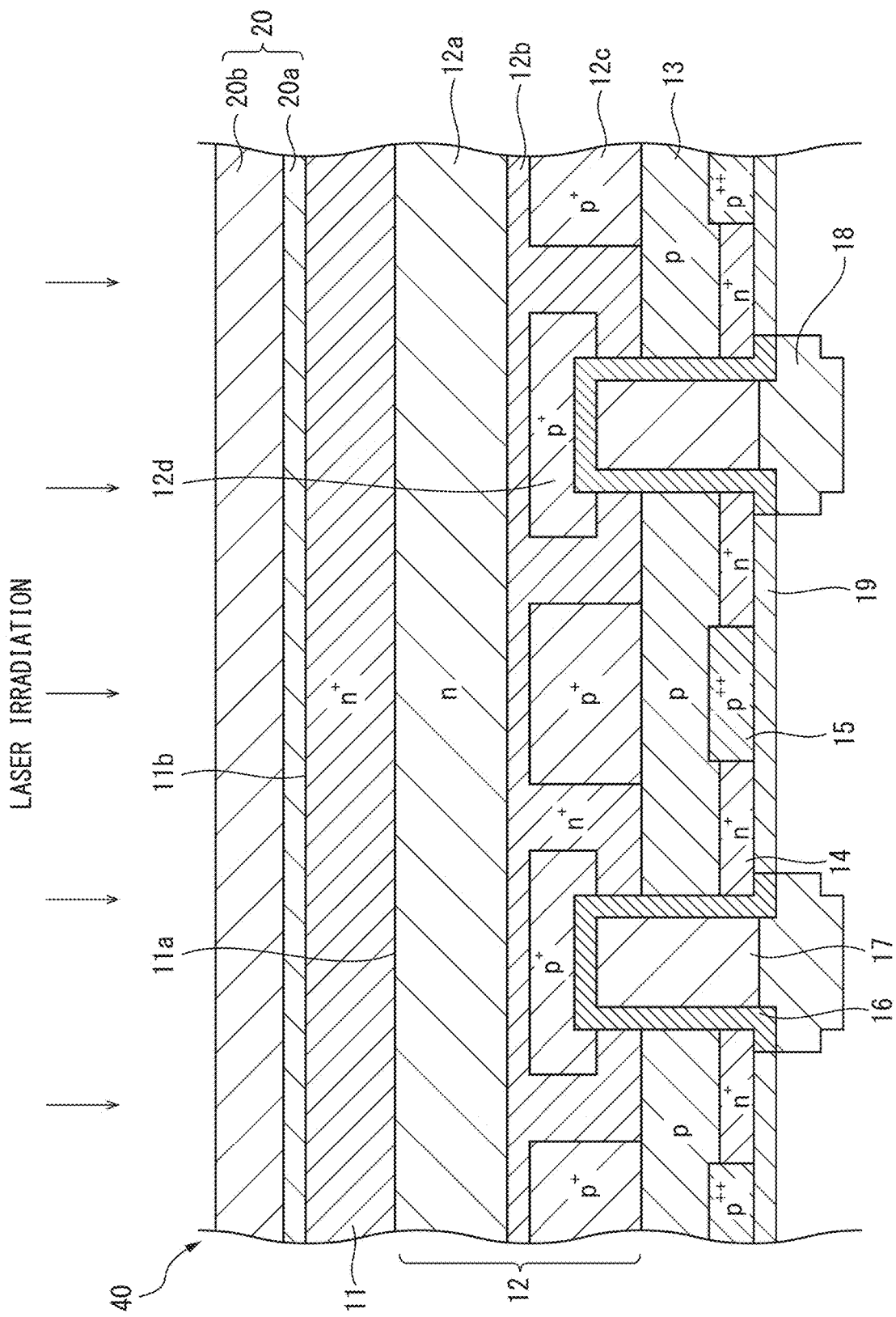
FIG. 6 is a diagram (4) illustrating the steps of one embodiment of the method for manufacturing the semiconductor device disclosed herein.

Next, as shown in FIG. 6, the ohmic junction metal element layer 42 is spot irradiated with pulse form laser light in a nitrogen atmosphere, forming an ohmic junction layer 20 on the second surface 11b of the substrate structure 40. The ohmic junction layer 20 has a first layer 20a that is directly disposed on the second surface 11b and that includes a silicide of titanium, carbon, and a silicide of an ohmic junction metal element, and a second layer 20b that is directly disposed on the first layer 20a, that includes a silicide of titanium, carbon, and a silicide of an ohmic junction metal element, and that has a lower titanium concentration than the first layer 20a.

Irradiation of the ohmic junction metal element layer 42 with laser light causes a portion of the ohmic junction metal element layer 42, the titanium layer 41 and the second surface 11b side of the n$^+$-type silicon carbide substrate 11 to be rapidly heated. Such local rapid heating of a portion of the ohmic junction metal element layer 42 side of the substrate structure 40 is preferred in that the portions that include the gate insulating film 16 and source region 14 disposed on the first surface 11a side of the n$^+$-type silicon carbide substrate 11 will be protected from being heated.

The energy density of the irradiated laser light is preferably in the range of 2/J cm$^2$ to 6/J cm$^2$. An energy density of at least 2/J cm$^2$ will allow sufficient heating for formation of the ohmic junction layer 20. An energy density of no greater than 6/J cm$^2$ will prevent heating of the portions including the gate insulating film 16 and source region 14 to a temperature that might result in their damage.

From the same viewpoint, the pulse width of the laser light is preferably in the range of 30 to 300 ns, and the exposure time with the laser light is preferably in the range of 20 to 80 ns.

The wavelength of the irradiated laser light is preferably selected from a wavelength band that allows a portion of the ohmic junction metal element layer 42, the titanium layer 41 and the second surface 11b side of the n$^+$-type silicon carbide substrate 11 to be heated. The wavelength of the laser light used may be 355 nm, for example.

The presumed mechanism by which an ohmic junction layer 20 is formed from a titanium layer 41 and ohmic junction metal element layer 42, will now be described using an example where the ohmic junction metal element layer 42 is formed using nickel, which has a lower melting point than titanium, as the ohmic junction metal element.

Rapid heating by irradiation of the ohmic junction metal element layer 42 with laser light first causes melting of the ohmic junction metal element layer 42 formed by nickel (melting point: 1455° C.) which has a lower melting point than titanium (melting point: 1668° C.), and this is then followed by melting of the titanium layer 41. Since the titanium layer 41 is still not completely melted at the point where the ohmic junction metal element layer 42 has melted, the titanium layer 41 is believed to act as a barrier, inhibiting nickel from reaching the second surface 1b of the n$^+$-type silicon carbide substrate 11.

After the titanium layer 41 has melted, and the temperature at which the n$^+$-type silicon carbide substrate 11 also decomposes (SiC→Si+C) has been reached, it is thought that the titanium and the carbon/silicon react in solid phase according to the following formula (1), producing titanium carbide (TiC) and titanium silicide (TiSi$_2$).

Ti+C→TiC $$Ti+2Si \rightarrow TiSi_2 \tag{1}$$

In addition, it is thought that the nickel and the titanium silicide (TiSi$_2$) react according to the following formula (2), producing titanium silicide (TiSi) and nickel silicides (NiSi, Ni$_2$Si).

TiSi$_2$+Ni→TiSi+NiSi $$TiSi_2+2Ni \rightarrow TiSi+Ni_2Si \tag{2}$$

By rapid cooling after stopping laser light irradiation, the regions that include the titanium carbide (TiC) and titanium silicide (TiSi$_2$) form a thin-film metal layer, thereby constituting the first layer 20a. The first layer 20a includes titanium carbide (TiC), titanium silicide (TiSi) and nickel silicides (NiSi, Ni$_2$Si). As the temperature rapidly decreases upon stopping laser light irradiation, the regions that include nickel silicide (NiSi) and titanium silicide (TiSi) form a thin-film metal layer, constituting the second layer 20b.

Since this reaction causes the titanium layer 41 to act as a barrier, inhibiting the nickel from reaching the second surface 11b of the n$^+$-type silicon carbide substrate 11, production of a carbon deposition layer in the ohmic junction layer 20 is inhibited. The tendency to form a carbon deposition layer when molten nickel reaches the second surface 11b of the n$^+$-type silicon carbide substrate 11 will be explained below. As it is believed that a compact first layer 20a including titanium carbide (TiC) and titanium silicide (TiSi$_2$) is formed since titanium and silicon carbide react in solid phase according to formula (1) near the second surface 11b of the n$^+$-type silicon carbide substrate 11, presumably production of voids in the ohmic junction layer 20 is also reduced.

Next, as shown in FIG. 1, a drain electrode 21 is formed on the ohmic junction layer 20, whereby a semiconductor device 10 is obtained.

The drain electrode 21 is formed, for example, by layering a titanium layer, a nickel layer and a gold layer in that order. The method of forming each layer may employ sputtering or vapor deposition, for example.

EXAMPLES

The semiconductor device disclosed herein will now be further explained using an Example. However, it is to be understood that the scope of the invention is not limited to the Example.

Example

Figure 7B:
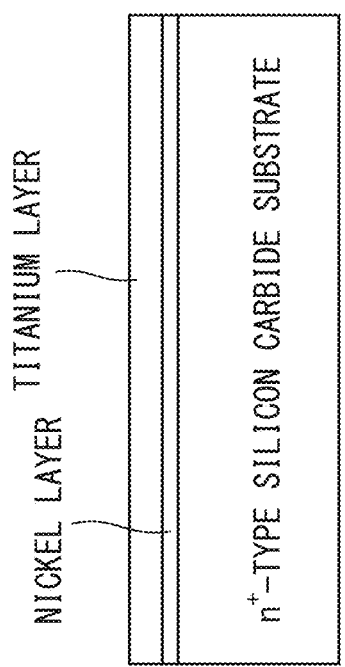
FIG. 7B is a diagram illustrating the steps for manufacturing the semiconductor device of the Comparative Example.
Figure 7A:
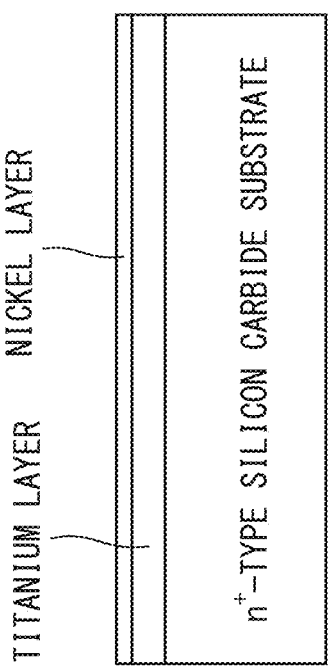
FIG. 7A is a diagram illustrating the steps for manufacturing the semiconductor device of the Example.

A titanium layer and nickel layer (corresponding to an ohmic junction metal element layer) were formed in that order on the (000-1) face (C face) of a single n$^+$-type silicon carbide substrate by sputtering, as shown in FIG. 7A, obtaining multiple substrate structures. The thickness of the titanium layer was 60 nm. The thickness of the nickel layer was 20 nm. Each substrate structure comprised a n$^+$-type silicon carbide substrate, as well as an n-type silicon carbide epitaxial layer, a p-type silicon carbide epitaxial layer, a source region, a contact region, a gate insulating film, a gate electrode, an interlayer dielectric film and a source electrode as in FIG. 3, but this diagram is simplified.

Next, the nickel layer on the titanium layer of each substrate structure was irradiated with laser light in a nitrogen atmosphere to rapidly heat it, after which it was cooled to form an ohmic junction layer on the n$^+$-type silicon carbide substrate. The energy density of the laser light was 2.6/J cm$^2$, the pulse width of the laser light was 50 ns, and the laser light exposure time was 70 ns.

After a drain electrode was then formed on the ohmic junction layer of each substrate structure, it was diced to obtain multiple semiconductor devices for the Example.

(State of Detachment)

No detachment of the drain electrode occurred in the individual semiconductor devices of the Example obtained by dicing.

(SEM Observation Results)

Figure 8:
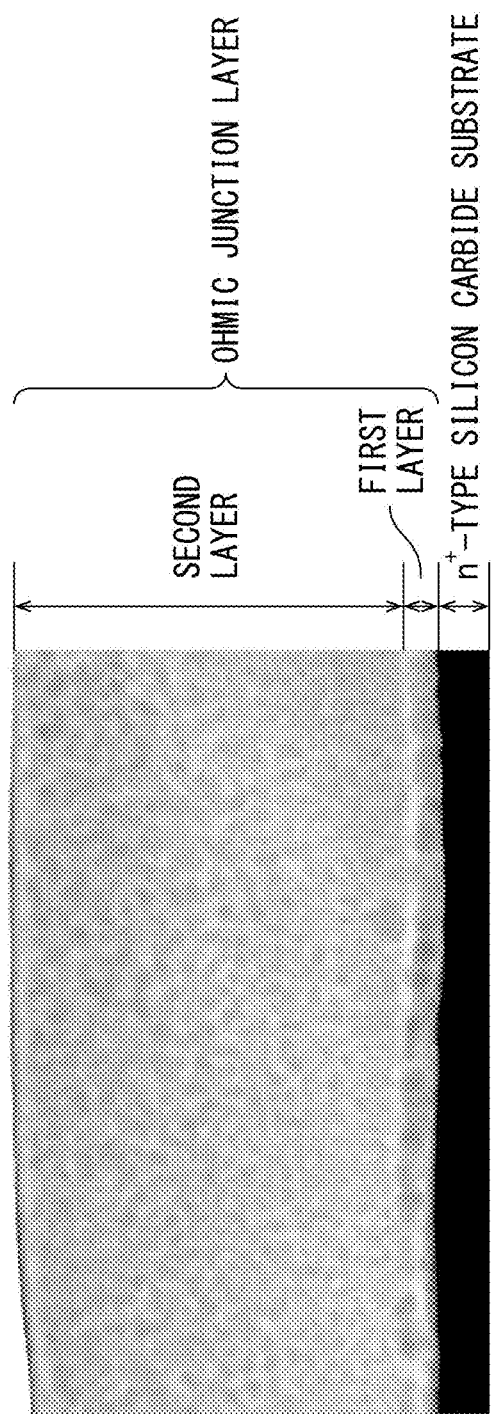
FIG. 8 is a SEM photograph image of the semiconductor device of the Example.

FIG. 8 shows a SEM (Scanning Electron Microscope) image of a cross section of a semiconductor device of the Example.

As shown in FIG. 8, the ohmic junction layer was confirmed to be formed with a first layer and second layer stacked in that order on an n$^+$-type silicon carbide substrate. No carbon deposition layer or voids were found to be present in the cross section of the semiconductor devices of the Example.

(Elemental Analysis Results)

FIG. 9 is a table showing the elemental analysis results for a cross section of a semiconductor device of the Example, by EDX (Energy Dispersive X-ray Spectrometry).

As shown in FIG. 9, the first layer and second layer included carbon, silicon, titanium and nickel.

As also shown in FIG. 9, the atomic percent (at %) concentration of titanium in the first layer was higher than in the second layer. The atomic percent concentration of nickel in the second layer was higher than the first layer. The atomic percent concentration of carbon in the first layer was higher than the second layer. The atomic percent concentration of silicon in the second layer was higher than the first layer.

Comparative Example

A nickel layer and titanium layer were formed in that order on the (000-1) face (C face) of a single n$^+$-type silicon carbide substrate by sputtering, as shown in FIG. 7B, obtaining multiple substrate structures. Multiple semiconductor devices were obtained for the Comparative Example in the same manner as the Example, except for the difference in order of the nickel layer and titanium layer.

(State of Detachment)

Detachment of the drain electrode occurred in the individual semiconductor devices of the Comparative Example obtained by dicing.

(SEM Observation Results)

Figure 10:
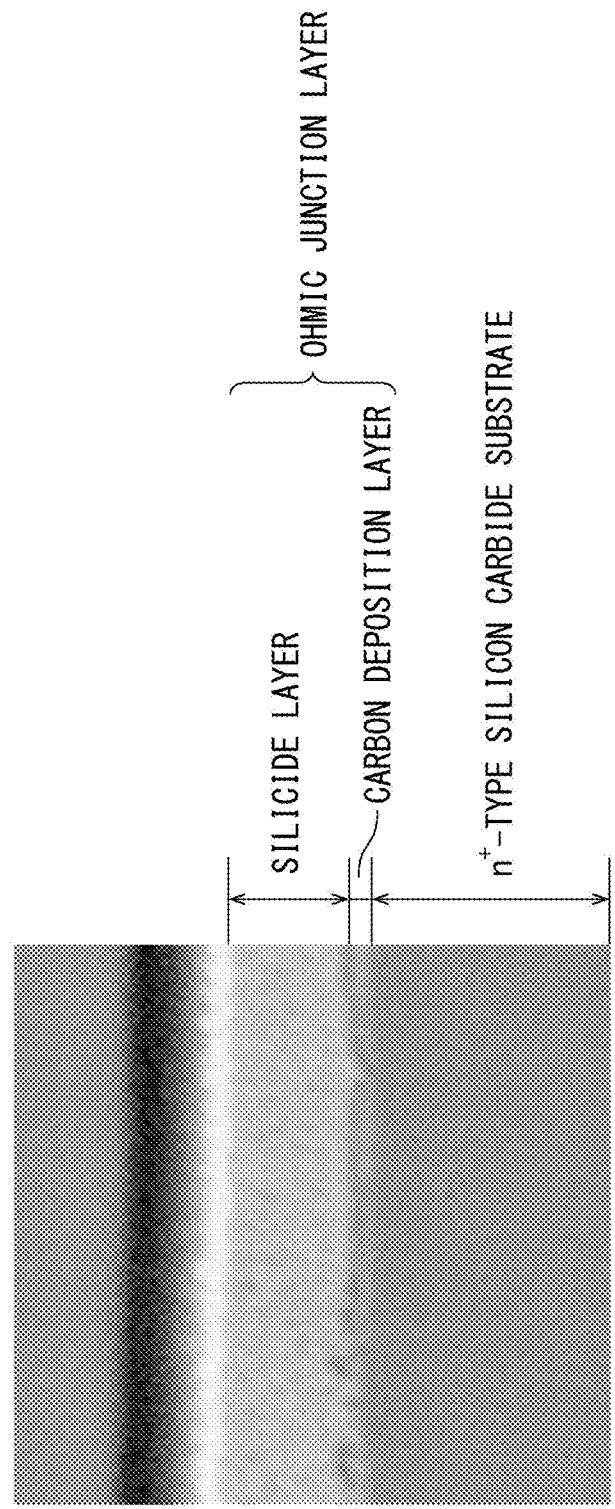
FIG. 10 is a SEM photograph image of the semiconductor device of the Comparative Example.

FIG. 10 shows a SEM photograph of a cross section of a semiconductor device of the Comparative Example.

As shown in FIG. 10, an ohmic junction layer was confirmed to have been formed with a carbon deposition layer and a silicide layer including nickel silicide and titanium silicide, stacked in that order on an n$^+$-type silicon carbide substrate.

The following is presumed to be the reason that a carbon deposition layer was formed in the semiconductor device of the Comparative Example while no carbon deposition layer was formed in the semiconductor device of the Example.

First, in the initial state where the nickel layer is formed on the n$^+$-type silicon carbide substrate, heat energy produced during formation of the nickel layer causes a portion of the n$^+$-type silicon carbide substrate surface to be decomposed into carbon (C) and silicon (Si), producing nickel silicide resulting from reaction between silicon and nickel, and a carbon deposition layer. Presumably, in this initial state in which a nickel layer is formed on the n$^+$-type silicon carbide substrate, some of the nickel is converted to a nickel, and a nickel layer composed solely of nickel being formed during the subsequent nickel layer formation stage. A titanium layer is then formed on the nickel layer.

Next, rapid heating of the titanium layer by irradiation of pulse laser light causes melting of the nickel silicide (melting point: 993° C. to 1305° C.) and nickel (melting point: 1455° C.) which have low melting points, while the carbon which has a high melting point (melting point: >3700° C.) does not melt.

The increased temperature by laser light irradiation then also leads to melting of the titanium layer (melting point: 1668° C.), the silicon of the molten nickel silicide reacting with titanium to produce titanium silicide. Presumably, upon reaching a temperature at which the n$^+$-type silicon carbide substrate is also decomposed (SiC→Si+C), it reacts with titanium to produce titanium carbide and titanium silicide, and reacts with nickel to produce nickel silicide.

In the semiconductor device of the Example, on the other hand, as mentioned above, it is believed that since a titanium layer which has high reactivity with carbon and a high melting point is formed on the second surface of the n$^+$-type silicon carbide substrate, deposition of carbon is inhibited.

It is also possible to inhibit detachment of the drain electrode and production of a carbon deposition layer, similar to the Example described above, when forming a semiconductor device using molybdenum, tantalum, tungsten, palladium and cobalt as ohmic junction metal elements.

The semiconductor device of the embodiments described above and the method for producing the semiconductor device may incorporate appropriate modifications that are still within the gist of the invention as described herein.

For example, the semiconductor device of the first embodiment was a vertical MOSFET with a trench-type gate electrode, but the semiconductor device may instead be a vertical MOSFET with a planar-type gate electrode.

The semiconductor device may also be an IGBT or thyristor device.

The semiconductor device of the second embodiment was a Schottky barrier diode, but the semiconductor device may instead be a PN-type or PIN-type diode.

Moreover, while the semiconductor devices of the embodiments described above had electrons as the majority carrier, they may instead be semiconductor devices with positive holes as the majority carrier. In this case, the ohmic junction layer is disposed on a p-type silicon carbide substrate.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device comprising:
   a first electrode;
   a silicon carbide substrate having a first surface electrically connected with the first electrode, and a second surface opposite to the first surface;
   an ohmic junction layer disposed on the second surface; and
   a second electrode disposed on the ohmic junction layer, wherein the ohmic junction layer comprises
   a first layer that is directly disposed on the second surface and includes a first silicide of titanium and a first silicide of a metal element other than titanium, and
   a second layer that is directly disposed on the first layer, includes a second silicide of titanium and a second silicide of the metal element, and has a lower titanium concentration than the first layer.

2. The semiconductor device according to claim 1, wherein the metal element in the second layer has a concentration higher than that of the metal element in the first layer.

3. The semiconductor device according to claim 1, wherein each of the first layer and second layer includes carbon, and carbon in the first layer has a concentration higher than that of carbon in the second layer.

4. The semiconductor device according to claim 1, wherein silicon in the second layer has a concentration higher than that of silicon in the first layer.

5. The semiconductor device according to claim 1, wherein the metal element has a melting point lower than that of titanium.

6. The semiconductor device according to claim 1, wherein the metal element includes at least one from among nickel, molybdenum, tantalum, tungsten, palladium and cobalt.

7. A method for manufacturing a semiconductor device, comprising steps of:
   providing a substrate structure that includes a first electrode, and a silicon carbide substrate having a first surface electrically connected to the first electrode, and having a second surface opposite to the first surface;
   forming a titanium layer on the second surface of the silicon carbide substrate;
   forming a metal element layer including a metal element other than titanium that is bondable with silicon to form a silicide, on the titanium layer;
   irradiating the metal element layer with laser light to form an ohmic junction layer having
      a first layer that includes a first silicide of titanium and a first silicide of the metal element other than titanium, directly disposed on the second surface of the silicon carbide substrate, and
      a second layer that includes a second silicide of titanium and a second silicide of the metal element, directly disposed on the first layer, the second layer having a lower titanium concentration than the first layer; and
   forming a second electrode on the ohmic junction layer.

8. The method according to claim 7, wherein the metal element in the second layer has a concentration higher than that of the metal element in the first layer.

9. The method according to claim 7, wherein each of the first layer and second layer includes carbon, and carbon in the first layer has a concentration higher than that of carbon in the second layer.

10. The method according to claim 7, wherein silicon in the second layer has a concentration higher than that of silicon in the first layer.

11. The method according to claim 7, wherein the metal element has a melting point lower than that of titanium.

12. The method according to claim 7, wherein the metal element includes at least one from among nickel, molybdenum, tantalum, tungsten, palladium and cobalt.

* * * * *